United States Patent
Sano et al.

(10) Patent No.: US 11,094,532 B2
(45) Date of Patent: Aug. 17, 2021

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Atsushi Sano, Toyama (JP); Kimihiko Nakatani, Toyama (JP); Tatsuru Matsuoka, Toyama (JP); Kenji Kameda, Toyama (JP); Satoshi Shimamoto, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/741,235

(22) Filed: Jan. 13, 2020

(65) Prior Publication Data

US 2020/0152444 A1    May 14, 2020

Related U.S. Application Data

(63) Continuation of application No. PCT/JP2018/018354, filed on May 11, 2018.

(30) Foreign Application Priority Data

Jul. 13, 2017  (JP) .............................. JP2017-137099

(51) Int. Cl.
*H01L 21/02* (2006.01)
*C23C 16/36* (2006.01)
*C23C 16/455* (2006.01)

(52) U.S. Cl.
CPC .......... *H01L 21/0214* (2013.01); *C23C 16/36* (2013.01); *C23C 16/45553* (2013.01);
(Continued)

(58) Field of Classification Search
CPC .......... H01L 21/0214; H01L 21/02126; H01L 21/02222; H01L 21/0228;
(Continued)

(56) References Cited

U.S. PATENT DOCUMENTS 8,647,722 B2 *   2/2014  Kobayashi .............. C23C 16/56
                                                        427/569
9,777,025 B2 *  10/2017  Girard ................... C23C 16/402
(Continued)

FOREIGN PATENT DOCUMENTS

JP      2005-536055 A    11/2005
JP      2006-054432 A     2/2006
(Continued)

OTHER PUBLICATIONS

Japanese Office Action dated Jun. 16, 2020 for the Japanese Patent Application No. 2019-528953.
(Continued)

*Primary Examiner* — Scott B Geyer
(74) *Attorney, Agent, or Firm* — Volpe Koenig (57) ABSTRACT

There is provided a technique that includes forming a film containing silicon, oxygen, carbon, and nitrogen on a substrate by performing a cycle a predetermined number of times, the cycle including: forming a first layer containing silicon, carbon, and nitrogen by performing a set a predetermined number of times, the set including: supplying a first precursor, which contains at least two Si—N bonds and at least one Si—C bond in one molecule, to the substrate; and supplying a second precursor, which contains nitrogen and hydrogen, to the substrate; and forming a second layer by supplying an oxidant to the substrate, to thereby oxidize the first layer.

15 Claims, 5 Drawing Sheets

(52) U.S. Cl.
CPC ........ *H01L 21/022* (2013.01); *H01L 21/0228* (2013.01); *H01L 21/02126* (2013.01); *H01L 21/02222* (2013.01); *H01L 21/02318* (2013.01)

(58) Field of Classification Search
CPC ........ C23C 16/45525; C23C 16/45527; C23C 16/45531; C23C 16/45553; C01B 21/0828
See application file for complete search history.

(56) References Cited

U.S. PATENT DOCUMENTS

| | | | |
|---|---|---|---|
| 2006/0032442 A1 | 2/2006 | Hasebe | |
| 2006/0178019 A1 | 8/2006 | Senzaki et al. | |
| 2006/0278952 A1 | 12/2006 | Mori et al. | |
| 2010/0136260 A1 | 6/2010 | Matsunaga et al. | |
| 2011/0215445 A1* | 9/2011 | Yang | C23C 16/30 257/632 |
| 2011/0262642 A1* | 10/2011 | Xiao | H01L 21/31608 427/255.394 |
| 2012/0184110 A1* | 7/2012 | Hirose | C23C 16/401 438/763 |
| 2014/0051261 A1 | 2/2014 | Ota et al. | |
| 2014/0158580 A1* | 6/2014 | Xiao | C07F 7/1804 206/524.3 |
| 2014/0213067 A1* | 7/2014 | Murakami | C23C 16/45531 438/763 |
| 2015/0118865 A1* | 4/2015 | Shimizu | C23C 16/30 438/786 |
| 2016/0233085 A1 | 8/2016 | Yamaguchi et al. | |
| 2016/0276148 A1* | 9/2016 | Qian | C23C 16/45525 |
| 2017/0117140 A1* | 4/2017 | Tak | C23C 16/30 |
| 2017/0140924 A1* | 5/2017 | Suzuki | H01L 21/0228 |
| 2017/0140925 A1* | 5/2017 | Suzuki | H01L 21/0228 |
| 2017/0268105 A1* | 9/2017 | Takeda | C23C 16/45542 |
| 2018/0087150 A1* | 3/2018 | Kerrigan | C23C 16/401 |
| 2018/0151355 A1* | 5/2018 | Fukazawa | H01L 21/02123 |
| 2018/0151690 A1* | 5/2018 | Han | H01L 21/02211 |
| 2018/0330980 A1* | 11/2018 | Liang | C23C 16/505 |

FOREIGN PATENT DOCUMENTS

| | | |
|---|---|---|
| JP | 2006-351694 A | 12/2006 |
| JP | 2010-090413 A | 4/2010 |
| JP | 2011-192875 A | 9/2011 |
| JP | 2014-168070 A | 9/2014 |
| JP | 2016-034042 A | 3/2016 |
| KR | 101378478 B1 | 3/2014 |
| WO | 2015/045099 A1 | 4/2015 |

OTHER PUBLICATIONS

International Search Report, PCT/JP2018/018354, dated Jul. 10, 2018, 2 pgs.
Korean Office Action dated Feb. 24, 2021 for Korean Patent Application No. 10-2020-7000831.

\* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is a Bypass Continuation Application of PCT international Application No. PCT/JP2018/018354, filed on May 11, 2018 and designating the United States, the international application being based upon and claiming the benefit of priority from Japanese Patent Application No. 2017-137099, filed on Jul. 13, 2017, the entire content of which is incorporated herein by reference.

TECHNICAL FIELD

The present disclosure relates to a method of manufacturing a semiconductor device, a substrate processing apparatus, and a recording medium.

BACKGROUND

As a process of manufacturing a semiconductor device, a process of forming a film containing silicon (Si), oxygen (O), carbon (C) and nitrogen (N), namely, a silicon oxycarbonitride film (SiOCN film), on a substrate is often carried out.

SUMMARY

Some embodiments of the present disclosure provide a technique capable of improving the controllability of composition of a film formed on a substrate.

According to one embodiment of the present disclosure, there is provided a technique that includes forming a film containing silicon, oxygen, carbon, and nitrogen on a substrate by performing a cycle a predetermined number of times, the cycle including: forming a first layer containing silicon, carbon, and nitrogen by performing a set a predetermined number of times, the set including: supplying a first precursor, which contains at least two Si—N bonds and at least one Si—C bond in one molecule, to the substrate; and supplying a second precursor, which contains nitrogen and hydrogen, to the substrate; and forming a second layer by supplying an oxidant to the substrate, to thereby oxidize the first layer.

DETAILED DESCRIPTION

One Embodiment of the Present Disclosure

One embodiment of the present disclosure will now be described with reference to FIGS. 1 to 4.

(1) Configuration of Substrate Processing Apparatus

Figure 1:
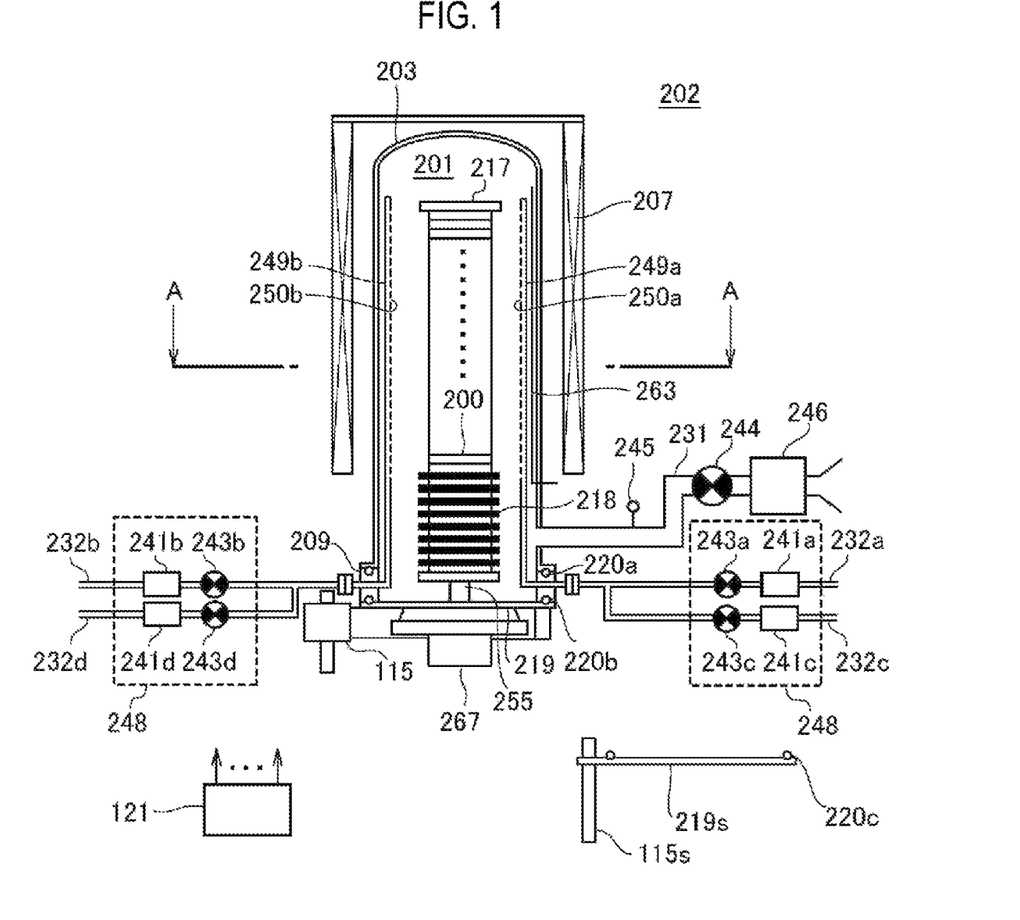
FIG. 1 is a schematic configuration diagram of a vertical process furnace of a substrate processing apparatus suitably used in an embodiment of the present disclosure, in which a portion of the process furnace is illustrated in a vertical cross sectional view.

As illustrated in FIG. 1, a process furnace 202 includes a heater 207 as a heating mechanism (a temperature adjustment part). The heater 207 has a cylindrical shape and is supported by a holding plate so as to be vertically installed. The heater 207 also functions as an activation mechanism (an excitation part) configured to thermally activate (excite) gas.

A reaction tube 203 is disposed inside the heater 207 to be concentric with the heater 207. The reaction tube 203 is made of a heat resistant material such as, for example, quartz ($SiO_2$), silicon carbide (SiC) or the like, and has a cylindrical shape with its upper end closed and its lower end opened. A manifold 209 is disposed under the reaction tube 203 to be concentric with the reaction tube 203. The manifold 209 is made of a metal material such as, for example, stainless steel (SUS: Steel Use Stainless) or the like, and has a cylindrical shape with both of its upper and lower ends opened. The upper end portion of the manifold 209 engages with the lower end portion of the reaction tube 203 so as to support the reaction tube 203. An O-ring 220a serving as a seal member is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to accommodate wafers 200 as substrates.

Nozzles 249a and 249b are installed in the process chamber 201 so as to penetrate a sidewall of the manifold 209. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are installed in the gas supply pipes 232a and 232b, respectively, sequentially from the upstream side of a gas flow. Gas supply pipes 232c and 232d are connected to the gas supply pipes 232a and 232b at downstream sides of the valves 243a and 243b, respectively. MFCs 241c and 241d and valves 243c and 243d are installed in the gas supply pipes 232c and 232d, respectively, sequentially from the upstream side of the gas flow.

Figure 2:
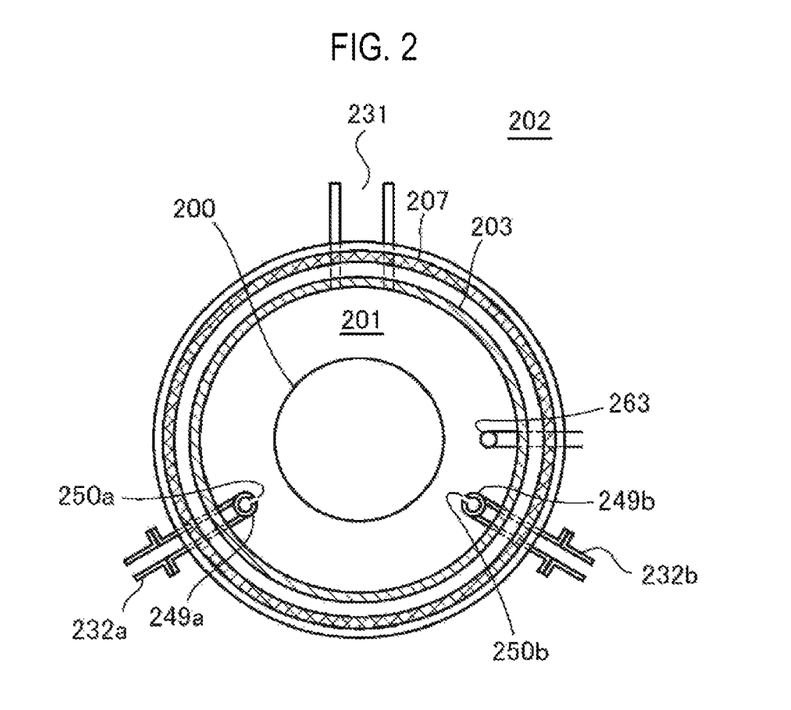
FIG. 2 is a schematic configuration diagram of the vertical process furnace of the substrate processing apparatus suitably used in an embodiment of the present disclosure, in which a portion of the process furnace is illustrated in a cross sectional view taken along the line A-A in FIG. 1.

As illustrated in FIG. 2, each of the nozzles 249a and 249b is installed in a space with an annular plan-view shape between an inner wall of the reaction tube 203 and the wafers 200 so as to extend upward along a stacking direction of the wafers 200 from a lower portion of the inner wall of the reaction tube 203 to an upper portion of the inner wall of the reaction tube 203. Specifically, each of the nozzles 249a and 249b is installed at a lateral side of a wafer arrangement region, in which the wafers 200 are arranged, namely in a region horizontally surrounding the wafer arrangement region, so as to extend along the wafer arrangement region. Gas supply holes 250a and 250b for supplying gas are formed on side surfaces of the nozzles 249a and 249b, respectively. Each of the gas supply holes 250a and 250b is opened toward a center of the reaction tube 203 to allow the gas to be supplied toward the wafers 200. The gas supply holes 250a and 250b may be installed in a plural number between a lower portion of the reaction tube 203 and an upper portion of the reaction tube 203.

A first precursor (first precursor gas), which contains at least two Si—N bonds and at least one Si—C bond in one molecule, is supplied from the gas supply pipe 232a into the process chamber 201 via the MFC 241a, the valve 243a, and the nozzle 249a. The precursor gas refers to a gaseous precursor, for example, a precursor which remains in a gas state at room temperature and atmospheric pressure, or a gas obtained by vaporizing a precursor which remains in a liquid state at room temperature and atmospheric pressure. As the first precursor, a gas containing an organic silazane compound (first organic silazane compound), for example, a hexamethyldisilazane ($[CH_3]_3Si]_2NH$), abbreviation: HMDSN) gas, may be used. HMDSN is a precursor containing two Si—N bonds and six Si—C bonds in one molecule.

A second precursor (second precursor gas), which contains N and hydrogen (H), is supplied from the gas supply pipe 232b into the process chamber 201 via the MFC 241b, the valve 243b, and the nozzle 249b. As the second precursor, for example, an ammonia ($NH_3$) gas may be used.

An oxidant (oxidizing gas) containing 0 is supplied from the gas supply pipe 232b into the process chamber 201 via the MFC 241b, the valve 243b, and the nozzle 249b. As the oxidant, for example, an oxygen ($O_2$) gas may be used.

An inert gas is supplied from the gas supply pipes 232c and 232d into the process chamber 201 via the MFCs 241c and 241d, the valves 243c and 243d, the gas supply pipes 232a and 232b, and the nozzles 249a and 249b, respectively. As the inert gas, for example, a nitrogen ($N_2$) gas may be used. The $N_2$ gas acts as a purge gas or a carrier gas.

A first precursor supply system mainly includes the gas supply pipe 232a, the MFC 241a, and the valve 243a. A second precursor supply system and an oxidant supply system each mainly include the gas supply pipe 232b, the MFC 241b, and the valve 243b. An inert gas supply system mainly includes the gas supply pipes 232c and 232d, the MFCs 241c and 241d, and the valves 243c and 243d.

One or all of the above-described various supply systems may be configured as an integrated-type supply system 248 in which the valves 243a to 243d, the MFCs 241a to 241d, and so on are integrated. The integrated-type supply system 248 is connected to each of the gas supply pipes 232a to 232d. In addition, the integrated-type supply system 248 may be configured such that operations of supplying various gases into the gas supply pipes 232a to 232d, that is, opening/closing operation of the valves 243a to 243d, flow rate adjustment operation by the MFCs 241a to 241d, and the like, are controlled by a controller 121 which will be described later. The integrated-type supply system 248 is configured as an integral type or division type integrated unit, and may be detachable from the gas supply pipes 232a to 232d and the like on an integrated unit basis, so that it may be possible to perform the maintenance, replacement, expansion, etc. of the integrated-type supply system 248 on an integrated unit basis.

An exhaust pipe 231 for exhausting an internal atmosphere of the process chamber 201 is installed below a sidewall of the reaction tube 203. A vacuum pump 246, as a vacuum-exhausting device, is connected to the exhaust pipe 231 via a pressure sensor 245, which is a pressure detector (pressure detection part) for detecting an internal pressure of the process chamber 201, and an auto pressure controller (APC) valve 244, which is a pressure regulator (pressure adjustment part). The APC valve 244 is configured so that a vacuum exhaust and a vacuum exhaust stop of the interior of the process chamber 201 can be performed by opening or closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhausting system mainly includes the exhaust pipe 231, the APC valve 244 and the pressure sensor 245. The exhausting system may include the vacuum pump 246.

A seal cap 219, which serves as a furnace opening cover configured to hermetically seal a lower end opening of the manifold 209, is installed under the manifold 209. The seal cap 219 is made of a metal material such as, for example, stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is provided under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads/unloads (transfers) the wafers 200 into and from (out of) the process chamber 201 by moving the seal cap 219 up and down. In addition, a shutter 219s, which serves as a furnace opening cover configured to hermetically seal a lower end opening of the manifold 209 in a state where the boat 217 is unloaded from the process chamber 201 by lowering the seal cap 219, is installed under the manifold 209. The shutter 219s is made of a metal material such as, for example, stainless steel (SUS) or the like, and is formed in a disc shape. An O-ring 220c, which is a seal member making contact with the lower end portion of the manifold 209, is installed on an upper surface of the shutter 219s. The opening/closing operation (such as elevation operation, rotation operation or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is provided in the reaction tube 203. Based on temperature information detected by the temperature sensor 263, a state of supplying electric power to the heater 207 is adjusted such that an interior of the process chamber 201 has a desired temperature distribution. The temperature sensor 263 is installed along the inner wall of the reaction tube 203.

Figure 3:
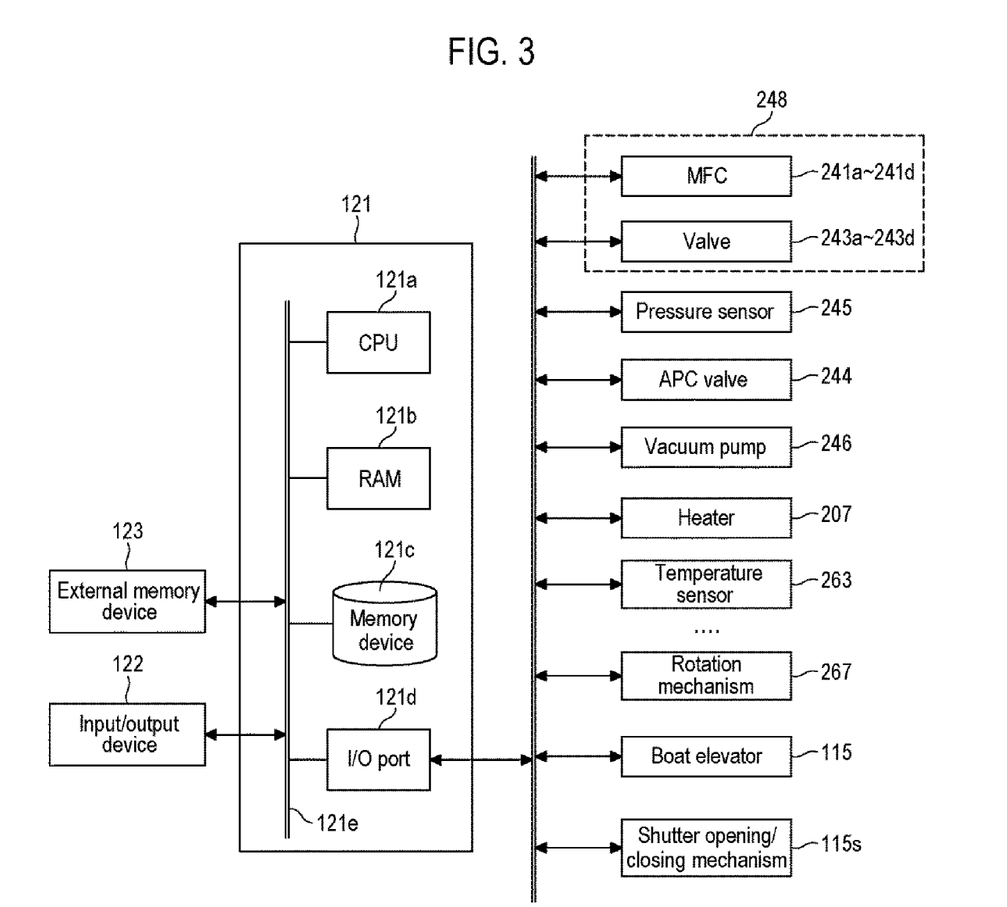
FIG. 3 is a schematic configuration diagram of a controller of the substrate processing apparatus suitably used in an embodiment of the present disclosure, in which a control system of the controller is illustrated in a block diagram.

As illustrated in FIG. 3, a controller 121, which is a control part (control means), may be configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 formed of, for example, a touch panel or the like, is connected to the controller 121.

The memory device 121c is configured by, for example, a flash memory, a hard disk drive (HDD), or the like. A control program for controlling operations of a substrate processing apparatus and a process recipe, in which sequences and conditions of a film-forming process to be described later are written, are readably stored in the memory device 121c. The process recipe functions as a program for causing the controller 121 to execute each sequence in the film-forming process, which will be described later, to obtain an expected result. Hereinafter, the process recipe and the control program may be collectively and simply referred to as a "program." Furthermore, the process recipe may be simply referred to as a "recipe." When the term "program" is used herein, it may indicate a case of including the recipe, a case of including the control program, or a case of including both the recipe and the control program. In addition, the RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, the shutter opening/closing mechanism 115s, and the like.

The CPU 121a is configured to read the control program from the memory device 121c and execute the same. The CPU 121a also reads the recipe from the memory device 121c according to an input of an operation command from the input/output device 122. In addition, the CPU 121a is configured to control the flow rate adjustment operation of various kinds of gases by the MFCs 241a to 241d, the opening/closing operation of the valves 243a to 243d, the opening/closing operation of the APC valve 244, the pressure adjusting operation performed by the APC valve 244 based on the pressure sensor 245, the actuating and stopping of the vacuum pump 246, the temperature adjustment operation performed by the heater 207 based on the temperature sensor 263, the operation of rotating the boat 217 with the rotation mechanism 267 and adjusting the rotation speed of the boat 217, the operation of moving the boat 217 up and down by the boat elevator 115, the opening/closing operation of the shutter 219s by the shutter opening/closing mechanism 115s and the like, according to contents of the read recipe.

The controller 121 may be configured by installing, on the computer, the aforementioned program stored in an external memory device 123 (for example, a magnetic disk such as an HDD, an optical disc such as a CD, a magneto-optical disc such as an MO, a semiconductor memory such as a USB memory). The memory device 121c or the external memory device 123 is configured as a non-transitory computer-readable recording medium. Hereinafter, the memory device 121c and/or the external memory device 123 may be collectively and simply referred to as a "recording medium." When the term "recording medium" is used herein, it may indicate a case of including the memory device 121c, a case of including the external memory device 123, or a case of including both the memory device 121c and the external memory device 123. Furthermore, the program may be provided to the computer using communication means such as the Internet or a dedicated line, instead of using the external memory device 123.

(2) Substrate Processing Process

A sequence example of forming a SiOCN film on a wafer 200 as a substrate using the aforementioned substrate processing apparatus, which is one of the processes for manufacturing a semiconductor device, will be described with reference to FIG. 4. In the following descriptions, the operations of the respective parts constituting the substrate processing apparatus are controlled by the controller 121.

Figure 4:
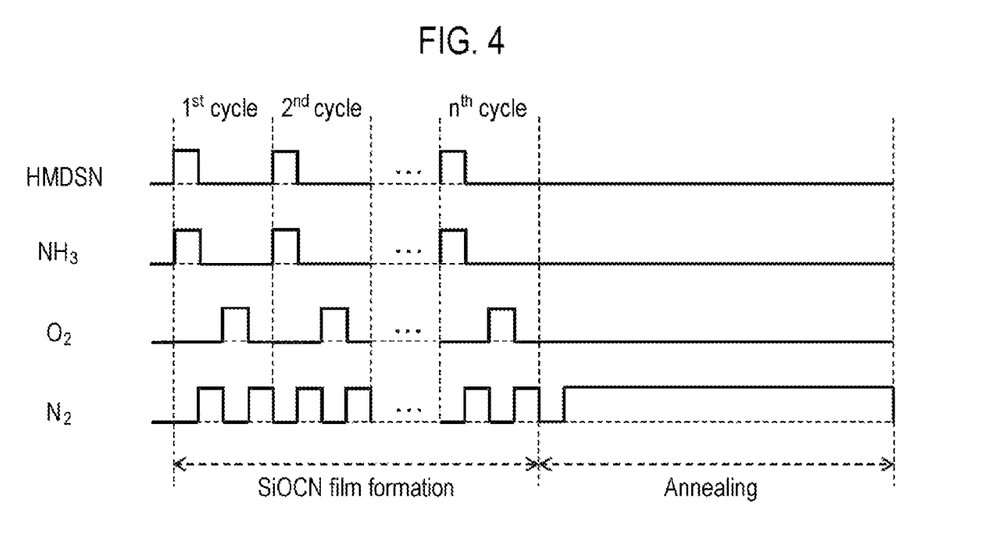
FIG. 4 is a diagram showing a substrate processing sequence according to an embodiment of the present disclosure.

The substrate film-forming sequence illustrated in FIG. 4A includes: performing a film-forming step of forming a first film (SiOCN film) containing Si, O, C, and N on a wafer 200 by performing a cycle a predetermined number of times, the cycle including: step 1 of forming a first layer (SiCN layer) containing Si, C, and N on the wafer 200 by performing a set a predetermined number of times, the set including: step a of supplying an HMDSN gas as a first precursor to the wafer 200; and step b of supplying an $NH_3$ gas as a second precursor to the wafer 200; and step 2 of forming a second layer (SiOCN layer) by supplying an $O_2$ gas as an oxidant to the wafer 200, to thereby oxidize the first layer.

The substrate processing sequence illustrated in FIG. 4 shows a case where, in step 1, a set in which step a and step b are performed simultaneously is performed once, and in the film-forming step, a cycle in which step 1 and step 2 are performed non-simultaneously is performed multiple times (n times).

The substrate processing sequence illustrated in FIG. 4 also shows a case where an annealing step in which the first film is heat-treated (annealed) at a processing temperature higher than a processing temperature (first temperature to be described later) in the film-forming step is performed after the film-forming step is completed.

In the present disclosure, for the sake of convenience, the substrate processing sequence illustrated in FIG. 4 may be denoted as follows. The same denotation may be used in modifications to be described later.

(HMDSN+$NH_3$→$O_2$)×$n$→annealing⇒SiOCN

When the term "wafer" is used in the present disclosure, it may refer to a wafer itself or a wafer and a laminated body of certain layers or films formed on a surface of the wafer. When the phrase "a surface of a wafer" is used in the present disclosure, it may refer to a surface of a wafer itself or a surface of a predetermined layer formed on a wafer. When the expression "a predetermined layer is formed on a wafer" is used in the present disclosure, it may mean that a predetermined layer is formed directly on a surface of a wafer itself or that a predetermined layer is formed on a layer formed on a wafer. When the term "substrate" is used in the present disclosure, it may be synonymous with the term "wafer."

(Wafer Charging and Boat Loading)

When a plurality of wafers 200 are charged on the boat 217 (wafer charging), the shutter 219s is moved by the shutter opening/closing mechanism 115s and the lower end opening of the manifold 209 is opened (shutter open). Then, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Adjustment and Temperature Adjustment)

The interior of the process chamber 201, namely, a space in which the wafers 200 are placed, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. The wafers 200 in the process chamber 201 are heated by the heater 207 to a desired processing temperature (first temperature). In this operation, the state of supplying electric power to the heater 207 is feedback-controlled based on the temperature information detected by the temperature sensor 263 such that the interior of the process chamber 201 has a desired temperature distribution. The rotation of the wafers 200 by the rotation mechanism 267 is then initiated. All the actuation of the vacuum pump 246 and the heating and rotation of the wafers 200 may be continuously performed at least until processing of the wafers 200 is completed.

(Film-Forming Step)

The following Steps 1 and 2 are then performed in a sequential manner.

[Step 1]

In this step, step a of supplying an HMDSN gas to the wafer 200 in the process chamber 201 and step b of supplying an $NH_3$ gas to the wafer 200 in the process chamber 201 are simultaneously performed.

Specifically, the valves 243a and 243b are opened to allow the HMDSN gas and the $NH_3$ gas to flow into the gas supply pipes 232a and 232b, respectively. Flow rates of the HMDSN gas and the $NH_3$ gas are adjusted by the MFCs 241a and 241b, respectively; and then the HMDSN gas and the $NH_3$ gas are supplied into the process chamber 201 via the nozzles 249a and 249b, respectively, mixed in the process chamber 201, and exhausted from the exhaust pipe 231. In this operation, the HMDSN gas and the $NH_3$ gas are simultaneously (together) supplied to the wafer 200. In this operation, the valves 243c and 243d may be opened to allow an $N_2$ gas to flow into the gas supply pipes 232c and 232d, respectively.

The process conditions of this step are exemplified as follows.

Processing temperature (first temperature): 650 to 800 degrees C., specifically 700 to 750 degrees C.

Processing pressure: 67 to 2,660 Pa, specifically 133 to 1,333 Pa

HMDSN gas supply flow rate: 1 to 2,000 sccm $NH_3$ gas supply flow rate: 1 to 2,000 sccm $N_2$ gas supply flow rate (for each gas supply pipe): 0 to 10,000 sccm Gas supply time: 1 to 120 seconds The process conditions (temperature conditions and pressure conditions) described here are conditions that can generate an appropriate gas phase reaction or surface reaction when supplying the HMDSN gas and the $NH_3$ gas simultaneously. In the course of this reaction, at least a portion of Si—N bonds contained in HMDSN and at least a portion of Si—C bonds contained in HMDSN are held without being broken. This allows Si—N bonds and Si—C bonds to be added to the first film formed on the wafer 200. As a result, it becomes possible to improve ashing resistance (oxidation resistance) and etching resistance (hydrogen fluoride (HF) resistance) of the first film, that is, the processing resistance. In addition, by appropriately advancing the gas phase reaction or surface reaction, it is also possible to improve the film thickness uniformity of the first film or improve the quality of the film-forming process by suppressing generation of particles in the process chamber 201.

By simultaneously supplying the HMDSN gas and the $NH_3$ gas to the wafer 200 under the aforementioned conditions, as a first layer (initial layer), for example, a layer (a SiCN layer) containing Si, N, and C and having a thickness of one atomic layer (one molecular layer) or less to several atomic layers (several molecular layers) is formed on the outermost surface of the wafer 200. As described above, the Si—N bonds and the Si—C bonds, which are contained in HMDSN, are introduced into the first layer. Further, N components contained in $NH_3$ are introduced into the first layer, and at least a portion of the introduced N components newly constitutes a Si—N bond in the first layer. In this way, the first layer becomes a N-rich SiCN layer containing a larger amount of Si—N bonds than a layer formed when the HMDSN gas is alone supplied to the wafer 200.

After the first layer is formed on the wafer 200, the valves 243a and 243b are closed and the supply of HMDSN gas and $NH_3$ gas into the process chamber 201 is stopped. Then, the interior of the process chamber 201 is vacuum-exhausted and the gas remaining in the process chamber 201 is removed from the process chamber 201. At this time, the valves 243c and 243d are opened and an $N_2$ gas is supplied into the process chamber 201. The $N_2$ gas acts as a purge gas.

As the first precursor, in addition to the HMDSN gas, a gas containing an organic silazane compound such as a tetramethyldisilazane ($[H(CH_3)_2Si]_2NH$), abbreviation: TMDSN) gas may be used. TMDSN is a precursor containing two Si—N bonds and four Si—C bonds in one molecule.

As the second precursor, in addition to the $NH_3$ gas, a hydrogen nitride-based gas such as a diazene ($N_2H_2$) gas, a hydrazine ($N_2H_4$) gas, a $N_3H_8$ gas, etc. may be used. When these gases acting as a N source are used as the second precursor, the N concentration in the first film formed on the wafer 200 can be finely adjusted in the direction of increase.

Further, as the second precursor, in addition to the $NH_3$ gas, a gas containing amine may also be used. Examples of this gas may include an ethylamine-based gas such as a triethylamine (($C_2H_5)_3N$, abbreviation: TEA) gas, a diethylamine (($C_2H_5)_2NH$, abbreviation: DEA) gas, a monoethylamine ($C_2H_5NH_2$, abbreviation: MEA) gas or the like, a methylamine-base gas such as a trimethylamine (($CH_3)_3N$, abbreviation: TMA) gas, a dimethylamine (($CH_3)_2NH$, abbreviation: DMA) gas, a monomethylamine ($CH_3NH_2$, abbreviation: MMA) gas or the like, a propylamine-based gas such as a tripropylamine (($C_3H_7)_3N$, abbreviation: TPA) gas, a dipropylamine (($C_3H_7)_2NH$, abbreviation: DPA) gas, a monopropylamine ($C_3H_7NH_2$, abbreviation: MPA) gas or the like, an isopropylamine-based gas such as a triisopropylamine ($[(CH_3)_2CH]_3N$, abbreviation: TIPA) gas, a diisopropylamine ($[(CH_3)_2CH]_2NH$, abbreviation: DIPA) gas, a monoisopropylamine (($CH_3)_2CHNH_2$, abbreviation: MIPA) gas or the like, a butylamine-based gas such as a tributylamine (($C_4H_9)_3N$, abbreviation: TBA) gas, a dibutylamine (($C_4H_9)_2NH$, abbreviation: DBA) gas, a monobutylamine ($C_4H_9NH_2$, abbreviation: MBA) or the like, an isobutylamine-based gas such as a triisobutylamine ($[(CH_3)_2CHCH_2]_3N$, abbreviation: TIBA) gas, a diisobutylamine ($[(CH_3)_2CHCH_2]_2NH$, abbreviation: DIBA) gas, a monoisobutylamine (($CH_3)_2CHCH_2NH_2$, abbreviation: MIBA) or the like, etc. When these gases acting as a N source and a C source are used as the second precursor, the N concentration and the C concentration in the first film formed on the wafer 200 can be finely adjusted in the direction of increase.

In addition, as the second precursor, a gas containing an organic hydrazine compound may also be used. Examples of this gas may include a methylhydrazine-based gas such as a monomethylhydrazine (($CH_3)HN_2H_2$, abbreviation: MMH) gas, a dimethyl hydrazine (($CH_3)_2N_2H_2$, abbreviation: DMH) gas, a trimethylhydrazine (($CH_3)_2N_2(CH_3)H$, abbreviation: TMH) gas, or the like, and an ethylhydrazine-based gas such as an ethylhydrazine (($C_2H_5)HN_2H_2$, abbreviation: EH) gas or the like. When these gases acting as a N source and a C source are used as the second precursor, each of the N concentration and the C concentration in the first film formed on the wafer 200 can be finely adjusted in the direction of increase.

Further, as the second precursor, a gas containing a second organic silazane compound, which contains at least two Si—N bonds and at least one Si—C bond in one molecule and has a molecular structure (chemical structure) different from that of the first organic silazane compound, may also be used. As this gas, for example, when the HMDSN gas is used as the first precursor, a TMDSN gas having a silyl group different from the HMDSN gas may be used. When this gas acting as a Si source, a N source and a C source is used as the second precursor, the Si concentration, the N concentration, and the C concentration in the first film formed on the wafer 200 can be finely adjusted in the direction of increase.

As the inert gas, in addition to the $N_2$ gas, various types of rare gases such as, for example, Ar gas, He gas, Ne gas, Xe gas, and the like may be used. This also applies to step 2 and an annealing step to be described later.

[Step 2]

After step 1 is completed, an $O_2$ gas is supplied to the wafer 200 in the process chamber 201, that is, the first layer formed on the wafer 200.

Specifically, the opening/closing control of the valves 243b to 243d is performed in the same procedure as the opening/closing control of the valves 243a, 243c and 243d in step 1. The flow rate of the $O_2$ gas is adjusted by the MFC 241b, and the $O_2$ gas is supplied into the process chamber 201 via the nozzle 249b and is exhausted through the exhaust pipe 231. In this operation, the $O_2$ gas is supplied to the wafer 200.

The process conditions of this step are exemplified as follows.

Processing pressure: 133 to 3,999 Pa
$O_2$ gas supply flow rate: 1,000 to 10,000 sccm
Gas supply time: 1 to 120 seconds Other process conditions are the same as the process conditions in step 1.

By supplying the $O_2$ gas to the wafer 200 under the aforementioned conditions, at least a portion of the first layer formed on the wafer 200 in step 1 can be oxidized. Thereby, H and the like can be desorbed from the first layer, and the O component contained in the $O_2$ gas can be introduced into the first layer. As the first layer is oxidized, a silicon oxycarbonitride layer (SiOCN layer), which is a layer containing Si, O, C, and N, is formed as a second layer on the wafer 200.

At least under the aforementioned conditions, it is possible to introduce (leave) at least a portion of the Si—N bonds contained in the first layer and at least a portion of the Si—C bonds contained in the first layer without being broken in the second layer as they are. That is, under the aforementioned conditions, the oxidation of the first layer by the $O_2$ gas can be unsaturated (unsaturated oxidation) so that at least a portion of each of the Si—N bonds and Si—C bonds contained in the first layer remains as they are.

After the second layer is formed on the wafer 200, the valve 243b is closed and the supply of the $O_2$ gas into the process chamber 201 is stopped. Then, the gas remaining in the process chamber 201 is removed from the process chamber 201 according to the same processing procedure as in step 1.

As the oxidant, in addition to the $O_2$ gas, nitrous oxide ($N_2O$) gas, nitrogen monoxide (NO) gas, nitrogen dioxide ($NO_2$) gas, ozone ($O_3$) gas, hydrogen peroxide ($H_2O_2$) gas, water vapor ($H_2O$ gas), carbon monoxide (CO) gas, carbon dioxide ($CO_2$) gas, and the like may be used. By using a nitrogen oxide-based gas such as the $N_2O$ gas, the NO gas, or the $NO_2$ gas as the oxidant, the above-described oxidation can be performed softly. As a result, it becomes easier to leave a C component and an N component in the first film formed on the wafer 200, thereby improving the processing resistance of the film. In particular, since the $N_2O$ gas has weaker oxidizing power than the $O_2$ gas, the NO gas and so on, it becomes possible to further improve the controllability of the composition of the first film by using the $N_2O$ gas as the oxidant, which makes it easier to obtain the above-mentioned effect.

(Performing Predetermined Number of Times)

A cycle that non-simultaneously (i.e., asynchronously) performs steps 1 and 2 is performed a predetermined number of times (n times, n being an integer equal to or more than 1) to thereby form a SiOCN film having a predetermined composition and a predetermined film thickness, as the first film, on the wafer 200. This cycle may be repeated multiple times. That is, a thickness of the second layer formed per one cycle may be set to be smaller than a desired film thickness. Thus, the above cycle may be repeated multiple times until a film thickness of the film formed by laminating the second layers becomes equal to the desired film thickness.

(Annealing Step)

After the film-forming step is completed, the temperature of the wafer 200 is changed (increased) to a second temperature higher than the first temperature. Thereafter, annealing is performed on the first film formed on the wafer 200 under the second temperature. This step is performed in a state where the internal atmosphere of the process chamber 201 is an oxygen-free atmosphere. Specifically, this step is performed in a state where the HMDSN gas, the $NH_3$ gas and the $O_2$ gas are not supplied to the wafer 200, and the $N_2$ gas is supplied to the wafer 200.

By performing the annealing step in the state where the wafer 200 is heated to the second temperature higher than the first temperature, it is possible to desorb impurities contained in the first film from the first film. In addition, by performing the annealing step, it is possible to reduce the interatomic distance between atoms constituting the first film to densify the first film. By doing this, the processing resistance of the first film can be further increased.

The process conditions of this step are exemplified as follows.

Processing temperature (second temperature): 800 to 1,000 degrees C.
Processing pressure: 67 to 101,325 Pa
$N_2$ gas supply flow rate: 1,000 to 5,000 sccm
Annealing time: 1 second to 60 minutes (After-Purging and Returning to Atmospheric Pressure)

After the annealing step is completed, an $N_2$ gas is supplied into the process chamber 201 from each of the gas supply pipes 232c and 232d and is exhausted through the exhaust pipe 231. Thus, the interior of the process chamber 201 is purged and the residual gas and the reaction byproducts remaining in the process chamber 201 are removed from the interior of the process chamber 201 (after-purge). The internal atmosphere of the process chamber 201 is then substituted with an inert gas (inert gas substitution) and the internal pressure of the process chamber 201 is returned to an atmospheric pressure (returning to atmospheric pressure).

(Boat Unloading and Wafer Discharging)

The seal cap 219 is then moved down by the boat elevator 115 to open the lower end of the manifold 209. In addition, the processed wafers 200 supported by the boat 217 are unloaded from the lower end of the manifold 209 to the outside of the reaction tube 203 (boat unloading). After the boat unloading, the shutter 219s is moved, and the lower end opening of the manifold 209 is sealed by the shutter 219s through the O-ring 220c (shutter closing). The processed wafers 200 are discharged from the boat 217 (wafer discharging), after being unloaded from the reaction tube 203.

(3) Effects According to the Present Embodiment

According to the present embodiment, the controllability of the composition of the film formed on the wafer 200 can be improved, and one or more effects set forth below may be achieved.

(a) By using an HMDSN gas, which contains at least two Si—N bonds and at least one Si—C bond in one molecule, as the first precursor, it becomes easier to contain the Si—N bonds and Si—C bonds in the first film. As a result, it is possible to make the film excellent in processing resistance, particularly ashing resistance, while suppressing an increase in dielectric constant (increase in k value) of the first film.

(b) In step 1, the HMDSN gas and the $NH_3$ gas are simultaneously supplied to the wafer 200, which makes it possible to increase the amount of Si—N bonds added to the first film formed on the wafer 200 as compared with a case where the HMDSN gas is supplied to the wafer 200 alone in step 1. As a result, it is possible to further improve the excellent processing resistance of the first film.

(c) By performing the annealing step after the film-forming step, the first film can be modified into a dense film with few impurities. As a result, it is possible to further improve the processing resistance of the first film.

(d) The above-described effects can be obtained in the same manner when the first precursor other than the HMDSN gas is used, when the second precursor other than the $NH_3$ gas is used, or when the oxidant other than the $O_2$ gas is used.

(4) Modifications

The sequence of the film-forming process in the present embodiment is not limited to the aspects shown in FIG. 4 and may be changed as in the following modifications. Moreover, these modifications may be used in proper combination. Unless otherwise specified, the processing procedures and process conditions in each step of each modification are the same as the processing procedures and process conditions in each step of the above-described substrate processing sequence.

(First Modification)

As in a substrate processing sequence described below, in step b, a gas (for example, TEA gas or TMDSN gas) other than the $NH_3$ gas may be used as the second precursor. In addition, in step b, a plurality of types of gases may be used in combination (for example, $NH_3$ gas+TEA gas, or TMDSN gas+$NH_3$ gas) as the second precursor.

This modification can also achieve the same effect as the substrate processing sequence illustrated in FIG. 4. In addition, the composition of the first film formed on the wafer 200 can be controlled more precisely.

(Second Modification)

As in a substrate processing sequence described below, in step 1, a set which performs step a and step b simultaneously may be performed multiple times (m times, m being an integer equal to or more than 2).

$[(HMDSN+NH_3)\times m \to O_2]\times n \to$ annealing $\Rightarrow$ SiOCN $[(HMDSN+TEA)\times mO_2]\times n \to$ annealing $\Rightarrow$ SiOCN This modification can also achieve the same effect as the substrate processing sequence illustrated in FIG. 4. In addition, by performing a set performing step a and step b simultaneously multiple times, that is, by performing step a and step b intermittently multiple times, it is possible to improve the in-wafer plane thickness uniformity of the first film formed on the wafer 200 by appropriately suppressing the gas phase reaction in step 1 and to improve the quality of substrate processing by suppressing generation of particles in the process chamber 201. Moreover, it is possible to finely adjust the Si concentration, the N concentration, and the C concentration with respect to the O concentration in the first film formed on the wafer 200 in the direction of increase.

(Third Modification)

Figure 5:
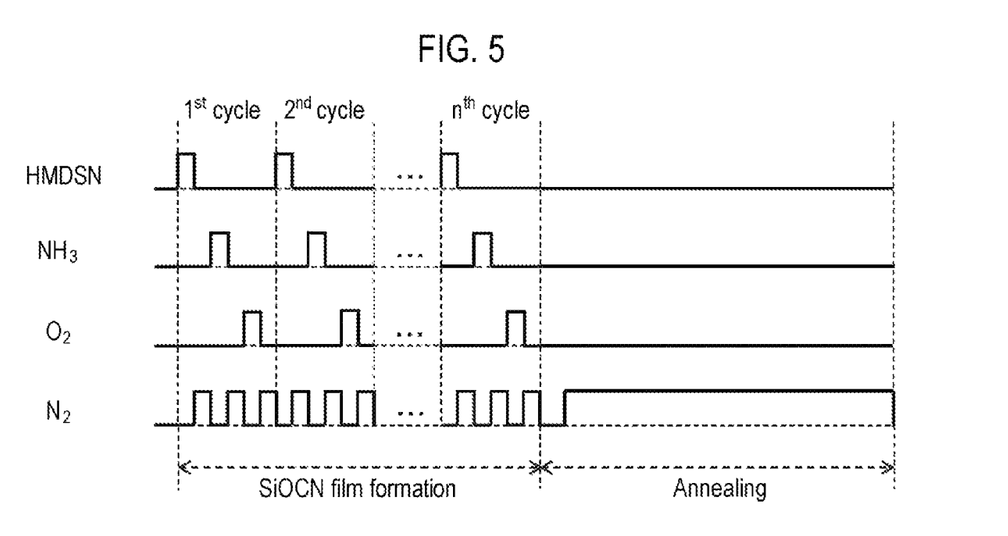
FIG. 5 is a diagram showing a modification of the substrate processing sequence according to the embodiment of the present disclosure.

As in a substrate processing sequence illustrated in FIG. 5 and described below, in step 1, step a and step b may be performed non-simultaneously. That is, a cycle performing step a, step b and step 2 may be performed non-simultaneously a predetermined number of times (n times, n being an integer equal to or more than 1). In this case, the execution order of the steps may be changed. Further, step b, step 2, and the like may be performed multiple times for each cycle. Further, when step b is performed multiple times for each cycle, the initial portion of them may be performed simultaneously with step a.

(HMDSN→NH$_3$→O$_2$)×$n$→annealing⇒SiOCN (HMDSN→O$_2$→NH$_3$)×$n$→annealing⇒SiOCN (HMDSN+NH$_3$→NH$_3$→O$_2$)→annealing⇒SiOCN (HMDSN+NH$_3$→O$_2$→NH$_3$)×$n$→annealing⇒SiOCN (HMDSN+NH$_3$→O$_2$→NH$_3$→O$_2$)×$n$→annealing⇒SiOCN This modification can also achieve the same effect as the substrate processing sequence illustrated in FIG. 4. In addition, the composition of the first film formed on the wafer 200 can be controlled more precisely.

(Fourth Modification)

Figure 6:
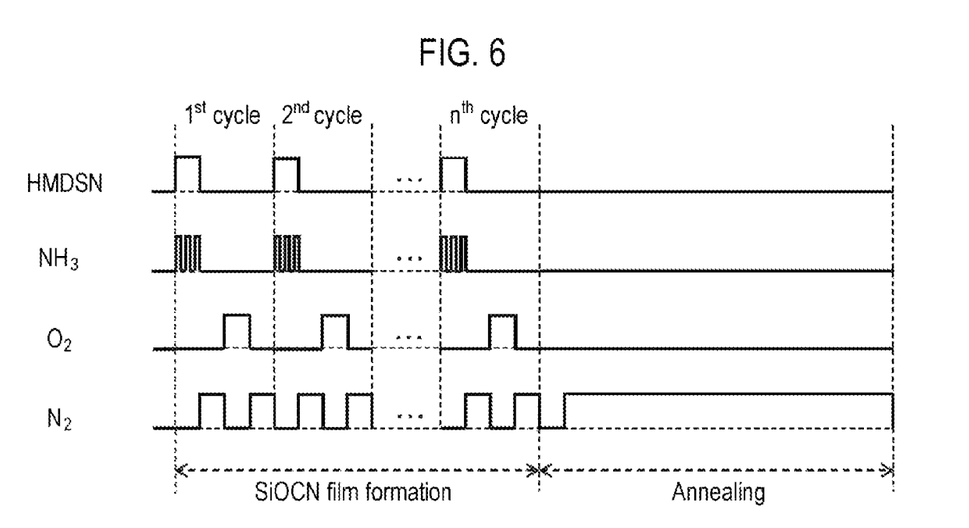
FIG. 6 is a diagram showing a modification of the substrate processing sequence according to the embodiment of the present disclosure.

In the substrate processing sequence illustrated in FIG. 4, the HMDSN gas and the NH$_3$ gas are continuously supplied in step 1. However, the present embodiment is not limited to such an aspect. For example, as illustrated in FIG. 6, in step 1, the HMDSN gas may be continuously supplied, while the NH$_3$ gas may be intermittently supplied multiple times. Further, for example, in step 1, the NH$_3$ gas may be continuously supplied, while the HMDSN gas may be intermittently supplied multiple times. Further, for example, in step 1, both the HMDSN gas and the NH$_3$ gas may be intermittently supplied multiple times. That is, in step 1, a set, which intermittently performs at least one selected from the group of step a and step b, may be performed a predetermined number of times.

This modification can also achieve the same effect as the substrate processing sequence illustrated in FIG. 4. In addition, by performing at least one selected from the group of step a and step b intermittently, it is possible to improve the in-wafer plane thickness uniformity of the first film formed on the wafer 200 by appropriately suppressing the gas phase reaction in step 1 and to improve the quality of substrate processing by suppressing generation of particles in the process chamber 201.

(Fifth Modification)

As in a substrate processing sequence described below, a step of forming the first film and a step of forming the second film, which contains Si, O, C, and N and has a different chemical composition from that of the first film, may be alternately performed (repeated) a predetermined number of times (n$_3$ times, n$_3$ being an integer equal to or more than 1), to thereby form a laminated film (nano-laminate film) in which the first film and the second film are alternately laminated at a nano level on the wafer 200.

[(HMDSN+NH$_3$→O$_2$)×$n_1$→(HMDSN→O$_2$)×$n_2$]×
$n_3$→annealing⇒SiOCN

[(HMDSN+NH$_3$→O$_2$)×$n_1$→(HMDSN+N$_2$O)×$n_2$]×
$n_3$→annealing⇒SiOCN

[(HMDSN+NH$_3$→O$_2$)×$n_1$→(HMDSN+TMDSN+
N$_2$O)×$n_2$]×$n_3$→annealing SiOCN

Similar to the substrate processing sequence illustrated in FIG. 4, the first film can be formed by performing a cycle including step 1 and step 2 a predetermined number of times (n$_1$ times, n$_1$ being an integer equal to or more than 1).

The second film can be formed by performing a cycle a predetermined number of times (n$_2$ times, n$_2$ being an integer equal to or more than 1), the cycle including: step 3 of forming a third layer (SiCN layer) containing Si, C, and N by supplying, for example, an HMDSN gas as a third precursor to the wafer 200; and step 4 of forming a fourth layer (SiOCN layer) by supplying, for example, an O$_2$ gas or an N$_2$O gas as an oxidant to the wafer 200, to thereby oxidize the third layer.

The processing procedure and process conditions in step 3 may be the same as those in step a, and the processing procedure and process conditions in step 4 may be the same as those in step 2. When the second film is formed, step 3 and step 4 may be performed non-simultaneously or simultaneously. When step 3 and step 4 are performed non-simultaneously, the O$_2$ gas or the like having a relatively strong oxidizing power may be used as the oxidant supplied in step 4. When step 3 and step 4 are performed simultaneously, the supply flow rate of the O$_2$ gas in step 4 may be set to a minute amount, or the N$_2$O gas having a relatively weak oxidizing power may be used as the oxidant supplied in step 4.

As the third precursor, a gas, which contains an organic silazane compound containing at least two Si—N bonds and at least one Si—C bond in one molecule, may be used as in the first precursor. As in the above-described substrate processing sequence, the third precursor may have the same molecular structure as the first precursor.

Ii desirable that the annealing temperature is higher than the processing temperature (the temperature of the wafer 200) in steps 1 to 4.

This modification can also achieve the same effect as the substrate processing sequence illustrated in FIG. 4. In addition, by setting the film thicknesses of the first film and the second film to 5 nm or less, specifically 1 nm or less, the finally formed laminated film can have uniform characteristics in the laminating direction, thereby obtaining a nano-laminate film having inseparable characteristics as a whole. By making the composition of the first film different from the composition of the second film, the composition ratio of the finally formed laminated film can be controlled over a wide range.

(Sixth Modification)

In the substrate processing sequence illustrated in FIG. 4 and the above-described modifications, the oxidant may be continuously supplied. For example, when the cycle is performed a predetermined number of times, the oxidant may be supplied into the process chamber 201 not only in step 2 and step 4 but also in step 1 and step 3. This modification can also achieve the same effects as the substrate processing sequence illustrated in FIG. 4. Further, according to this modification, it is possible to further promote the oxidation of the first film and the second film formed on the wafer 200, that is, the desorption of impurities from the films and the densification of the films. As a result, the finally formed film can be a film having a lower dielectric constant and better processing resistance.

Further, the supply of the oxidant into the process chamber 201 may be started prior to the supply of the first to third precursors into the process chamber 201. This modification can also achieve the same effects as the substrate processing sequence illustrated in FIG. 4. Moreover, according to this modification, it is possible to improve the initial state of film formation. For example, it is possible to modify the underlying surface layer of the film-forming process, thereby shortening the incubation time and improving the film quality at the initial stage of film formation.

(Seventh Modification)

In the substrate processing sequence illustrated in FIG. 4 and the above-described modifications, the supply flow rate of at least one selected from the group of the first to third precursors and the oxidant may be changed for each cycle or for each set. This modification can also achieve the same effects as the substrate processing sequence illustrated in FIG. 4. Further, according to this modification, it is possible to finely adjust the composition and characteristics of the first film and the second film formed on the wafer 200 or to change them in the film thickness direction.

(Eighth Modification)

In the substrate processing sequence illustrated in FIG. 4 and the above-described modifications, the annealing process may not be performed. The above-described effects can be obtained even if the annealing process is not performed. However, performing the annealing process makes it possible to further improve the processing resistance of the finally formed film.

OTHER EMBODIMENTS OF THE PRESENT DISCLOSURE

While some embodiments of the present disclosure have been described in detail above, the present disclosure is not limited to the aforementioned embodiments but may be differently modified without departing from the subject matter of the present disclosure.

For example, the case where the film-forming step and the annealing step are performed in the same process chamber 201 (in-situ) has been described in the above embodiments, but the present disclosure is not limited to such an aspect. That is to say, the film-forming step and the annealing step may be performed in different process chambers (ex-situ). When both the steps are performed in-situ, the wafer 200 is not exposed to the air in the course of the process and can be processed consistently and stably while keeping it in a vacuum atmosphere. If the respective steps are performed ex-situ, the temperature in each process chamber can be preset to, for example, a processing temperature at each step or a temperature close thereto, thereby reducing the time period needed for adjustment of temperature in the process chamber so that productivity can be improved.

Recipes used in substrate processing may be prepared individually according to the processing contents and may be stored in the memory device 121c via a telecommunication line or the external memory device 123. Moreover, at the beginning of the substrate processing, the CPU 121a may properly select an appropriate recipe from the recipes stored in the memory device 121c according to the contents of the processing. Thus, it is possible for a single substrate processing apparatus to form films of various kinds, composition ratios, qualities, and thicknesses with enhanced reproducibility. In addition, it is possible to reduce an operator's burden and to quickly start the substrate processing while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

The example in which films are formed using a batch-type substrate processing apparatus capable of processing a plurality of substrates at a time has been described in the above embodiments. The present disclosure is not limited to the above embodiments but may be appropriately applied, for example, to a case where films are formed using a single-wafer-type substrate processing apparatus capable of processing a single substrate or several substrates at a time. In addition, the example in which films are formed using a substrate processing apparatus provided with a hot-wall-type process furnace has been described in the above embodiments. The present disclosure is not limited to the above embodiments but may be appropriately applied to a case where films are formed using a substrate processing apparatus provided with a cold-wall-type process furnace.

In the case of using these substrate processing apparatuses, film formation may be performed according to the same processing procedures and process conditions as those in the above embodiments and modifications, and the same effects as those of the above embodiments and modifications can be achieved.

The above embodiments, modifications and so on may be used in proper combination. The processing procedures and process conditions used in this case may be the same as those of the above embodiments and modifications.

According to the present disclosure in some embodiments, it is possible to improve the controllability of composition of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a film containing silicon, oxygen, carbon, and nitrogen on a substrate by performing a cycle a predetermined number of times, the cycle including:
        forming a first layer containing silicon, carbon, and nitrogen by performing a set a predetermined number of times, the set including:
            supplying a first precursor, which contains at least two Si—N bonds and at least one Si—C bond in one molecule, to the substrate; and
            supplying a second precursor, which contains nitrogen and hydrogen, to the substrate; and
        forming a second layer by supplying an oxidant to the substrate, to thereby oxidize the first layer.

2. The method of claim 1, wherein the first precursor includes a first organic silazane compound, and
    wherein the second precursor includes at least one selected from the group of ammonia, amine, an organic hydrazine compound, and a second organic silazane compound which contains at least two Si—N bonds and at least one Si—C bond in one molecule and has a molecular structure different from a molecular structure of the first organic silazane compound.

3. The method of claim 1, wherein the set includes simultaneously performing the act of supplying the first precursor and the act of supplying the second precursor, and
    wherein the cycle includes non-simultaneously performing the act of forming the first layer and the act of forming the second layer.

4. The method of claim 1, wherein the set includes non-simultaneously performing the act of supplying the first precursor and the act of supplying the second precursor, and wherein the cycle includes non-simultaneously performing the act of forming the first layer and the act of forming the second layer.

5. The method of claim 1, wherein the set includes intermittently performing at least one selected from the group of the act of supplying the first precursor and the act of supplying the second precursor.

6. The method of claim 1, further comprising:
forming a second film, which contains silicon, oxygen, carbon, and nitrogen and has a chemical composition different from a chemical composition of the first film, on the first film by performing a cycle a predetermined number of times, the cycle including:
forming a third layer containing silicon, carbon, and nitrogen by supplying a third precursor, which contains at least two Si—N bonds and at least one Si—C bond in one molecule, to the substrate; and
forming a fourth layer by supplying an oxidant to the substrate, to thereby oxidize the third layer.

7. The method of claim 6, wherein the cycle in the act of forming the second film includes non-simultaneously performing the act of forming the third layer and the act of forming the fourth layer.

8. The method of claim 6, wherein the cycle in the act of forming the second film includes simultaneously performing the act of forming the third layer and the act of forming the fourth layer.

9. The method of claim 6, wherein a molecular structure of the third precursor is the same as the molecular structure of the first precursor.

10. The method of claim 6, further comprising forming a laminated film in which the first film and the second film are alternately laminated on the substrate by alternately repeating the act of forming the first film and the act of forming the second film multiple times.

11. The method of claim 10, further comprising annealing the laminated film at a processing temperature higher than a processing temperature in the act of forming the laminated film.

12. The method of claim 6, further comprising annealing the first film and the second film at a processing temperature higher than processing temperatures in the act of forming the first film and the act of forming the second film.

13. The method of claim 1, further comprising annealing the first film at a processing temperature higher than a processing temperature in the act of forming the first film.

14. A substrate processing apparatus comprising:
a process chamber in which a substrate is processed;
a first precursor supply system configured to supply a first precursor, which contains at least two Si—N bonds and at least one Si—C bond in one molecule, to the substrate in the process chamber;
a second precursor supply system configured to supply a second precursor, which contains nitrogen and hydrogen, to the substrate in the process chamber;
an oxidant supply system configured to supply an oxidant to the substrate in the process chamber; and
a controller configured to control the first precursor supply system, the second precursor supply system, and the oxidant supply system so as to perform a process of forming a film containing silicon, oxygen, carbon, and nitrogen on the substrate in the process chamber by performing a cycle a predetermined number of times, the cycle including:
forming a first layer containing silicon, carbon, and nitrogen by performing a set a predetermined number of times, the set including:
supplying the first precursor to the substrate; and
supplying the second precursor to the substrate; and
forming a second layer by supplying the oxidant to the substrate, to thereby oxidize the first layer.

15. A non-transitory computer-readable recording medium storing a program that causes, by a computer, a substrate processing apparatus to perform a process in a process chamber of the substrate processing apparatus, the process comprising:
forming a film containing silicon, oxygen, carbon, and nitrogen on a substrate by performing a cycle a predetermined number of times, the cycle including:
forming a first layer containing silicon, carbon, and nitrogen by performing a set a predetermined number of times, the set including:
supplying a first precursor, which contains at least two Si—N bonds and at least one Si—C bond in one molecule, to the substrate; and
supplying a second precursor, which contains nitrogen and hydrogen, to the substrate; and
forming a second layer by supplying an oxidant to the substrate, to thereby oxidize the first layer.

* * * * *